United States Patent [19]
Mori et al.

[11] Patent Number: 5,691,553
[45] Date of Patent: Nov. 25, 1997

[54] SEMICONDUCTOR DEVICE AND POWER CONVERTER USING SAME

[75] Inventors: Mutsuhiro Mori, Mito; Yasumichi Yasuda, Hitachi; Hiromi Hosoya, Hitachi, all of Japan

[73] Assignee: Hitachi, Ltd., Tokyo, Japan

[21] Appl. No.: 530,540

[22] Filed: Sep. 20, 1995

[30] Foreign Application Priority Data

Sep. 20, 1994 [JP] Japan ................... 6-224747

[51] Int. Cl.⁶ ................................... H01L 23/58
[52] U.S. Cl. .................. 257/328; 257/488; 257/487; 257/490; 257/494
[58] Field of Search ................... 257/488, 490, 257/494, 328, 489

[56] References Cited

U.S. PATENT DOCUMENTS 3,763,406  10/1973  Bosselaar ...................... 257/490
4,691,224   9/1987  Tarada ......................... 257/495

FOREIGN PATENT DOCUMENTS

| 0061551 | 12/1981 | European Pat. Off. |
| 59-76466 | 5/1984 | Japan . |
| 63-227063 | 9/1988 | Japan ................... 257/494 |
| 6-97469 | 4/1994 | Japan . |
| 6-268198 | 9/1994 | Japan . |
| 7-94704 | 4/1995 | Japan . |

*Primary Examiner*—William Mintel
*Attorney, Agent, or Firm*—Antonelli, Terry, Stout & Kraus, LLP.

[57] ABSTRACT

A high voltage semiconductor device is provided with a p layer which forms a main pn- junction, a plurality of p layers which surround the p layer in a ring form, a ring-like n+ layer which further surrounds those p layers, forward field plates extending in the peripheral direction and reverse field plates extending in the inside direction, the field plates being in contact at a low resistance with the p and n+ layers and reaching the surface of an n- layer through an insulating film, the area of the field plates being not less than one half of the n- surface. This arrangement is effective in stabilizing the blocking voltage of a high voltage semiconductor device which is used in a severe environment, and is vey effective in improving the reliabilty of a high voltage control unit.

11 Claims, 10 Drawing Sheets

FIG. 11

SEMICONDUCTOR DEVICE AND POWER CONVERTER USING SAME

BACKGROUND OF THE INVENTION

The present invention relates to a semiconductor device and a power converter using the same, particularly a planar type semiconductor device having a high blocking voltage not lower than 1.7 kV, as well as a power converter capable of handling a high voltage using such planar type semiconductor device.

Recently, improvements in blocking voltage of a planar type semiconductor devices has been remarkable. The term "planar type semiconductor device" refers to a semiconductor device wherein at least one pn junction is exposed to a main surface. In the planar type semiconductor device, as compared with the conventional mesa type and bevel type semiconductor devices, a high voltage blocking characteristic is obtained by only the diffusion of impurity from the main surface or the formation of an insulating film. Therefore, it is possible to share with a fine patterning process with an IC or an LSI. Fine patterning is essential for the improvement of performance even in the case of a high voltage semiconductor device, and the development of planar type semiconductor devices using a fine patterning process is remarkable.

Figure 3:
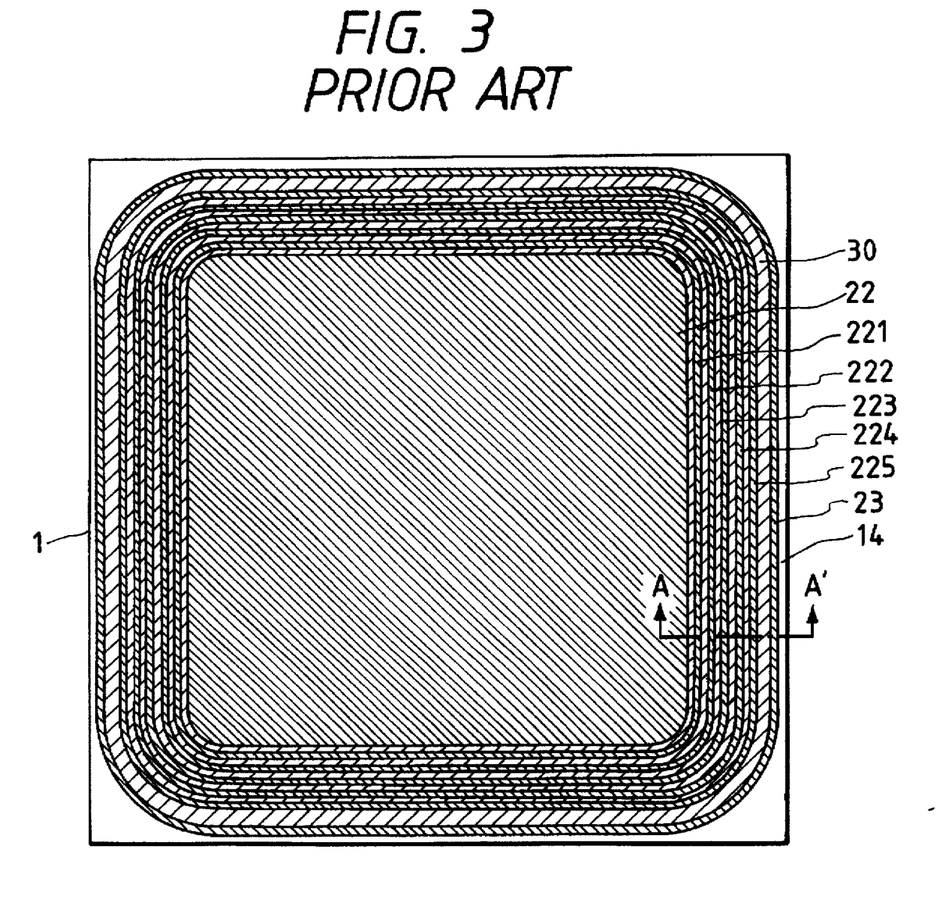
FIG. 3 is a plan view of a diode as an example of a conventional planar type semiconductor device.

FIG. 3 is a plan view of a diode as an example of a planar type semiconductor device. In the semiconductor device, indicated at 1, there are formed a main electrode 22, field plate electrodes 221, 222, 223, 224 and 225 which surround the main electrode 22 in the form of tracks, and an electrode 23 whose potential is fixed to the potential of an n+ layer 14 (the mark "n+" is not shown in FIG. 3) as an outermost peripheral portion of the semiconductor device 1.

Figure 4:
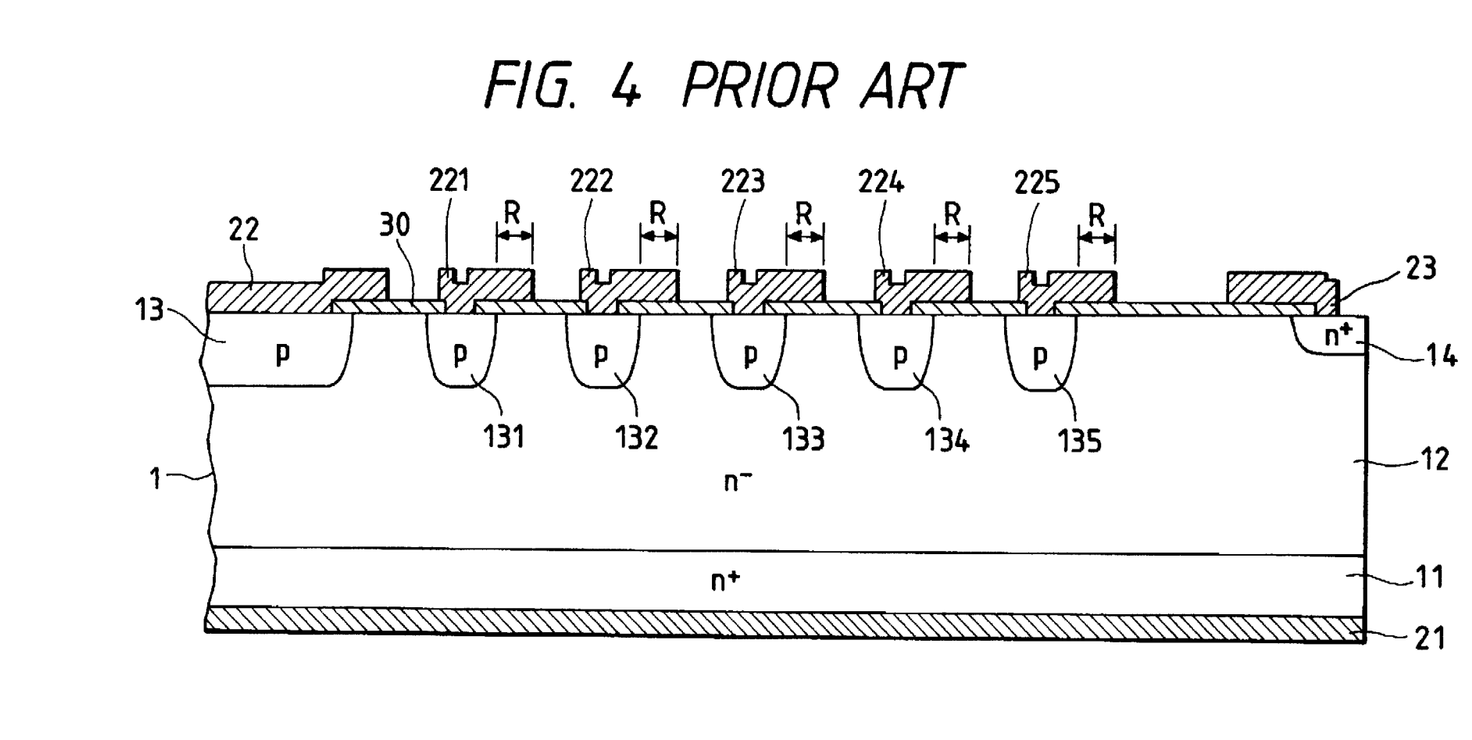
FIG. 4 is a sectional view taken on line A–A' of the semiconductor device shown in FIG. 3.

FIG. 4 is a sectional view taken on line A–A' of the semiconductor device of FIG. 3. In the semiconductor device 1, for example, an n– layer 12 is formed on a semiconductor substrate 11, and p layers 13, 131, 132, 133, 134 and 135 are diffused from an upper main surface, with n+ layer 14 being formed as an outermost peripheral layer. At a lower main surface, a main electrode 21 is in ohmic-contact with the semiconductor substrate 11. On the p layer 13 is formed the other electrode 22, a part of which extends onto the n– layer 12 through an insulating film 30. This portion is called a field plate which functions to relax an electric field induced upon reverse bias of both p layer 13 and n– layer 12. Particularly, this portion is effective in field relaxation of a corner region of the p layer 13 where the electric field is apt to become strong. The other p layers 131, 132, 133, 134 and 135 function to disperse applied voltages when a plus (i.e., positive) voltage is applied to one main electrode 21 and a minus (i.e., negative) voltage is applied to the other main electrode 22. The potential of the main electrode 21 is transmitted to the semiconductor substrate 11. Since the junction of the semiconductor substrate 11 and the n– layer 12 is n+/n– junction, both become almost equal in potential, and the n+ layer 14 also comes to have the same potential. Consequently, the p layer 13 and the n+ layer 14 assume the state of reverse bias, so that the p layers 131, 132, 133, 134 and 135 have an intermediate potential. For example, when 2,000 V is applied to one main electrode 21 and 0 V to the other main electrode 22, the potentials of the p layers 131, 132, 133, 134, 135 and n+ layer 14 are 300 V, 600 V, 900 V, 1,200 V, 1,500 V and about 2,000 V, respectively. By so dispersing the potentials it becomes possible to make the blocking voltage of the planar type semiconductor device 1 high.

Further, auxiliary electrodes 221, 222, 223, 224 and 225 are formed on the p layers 131, 132, 133, 134 and 135, respectively, each being provided with a field plate which has a length R extending on the n– layer 12. These field plates Rs also function to relax the electric field applied to the corner portions of the p layers. The n+ layer 14 is formed with a separate auxiliary electrode 23 and with a field plate extending inside the semiconductor device 1, which also functions to relax the electric field applied to the corner portion of the n+ layer 14. Thus, by both potential dispersion attained by the p layers 131, 132, 133, 134 and 135, and field relaxation attained by the field plates, it is possible to make the blocking voltage of the planar type semiconductor device high.

The p layers 131, 132, 133, 134 and 135 are each called an FLR (Field Limiting Ring). Further, the field plates extending on the n– layer toward the peripheral portion of the semiconductor device 1 are here designated as forward field plates (forward FPs), while the field plates extending toward the inside are here designated as reverse field plates (reverse FPs). Each voltage blocking region having FLR and FP is designated a termination region.

However, in the case where a planar type semiconductor device of a high blocking voltage having such FLRs and field plates are used in an inverter in a train such as, for example, a subway or a suburban train where the working environment is severe, the inverter undergoes great changes in humidity and temperature as compared with inverters used indoors. Consequently, there arise such problems as a decrease of blocking voltage and an increase of leakage current. Particularly, in an inverter train, the line voltage reaches 1,500 V, so even in the case of a three-level inverter having a neutral point voltage, a blocking voltage of 1,700 V or higher is required for the semiconductor device used therein. For implementing this requirement in terms of a planar structure, about eight or more FLRs are needed. The length of the termination region sometimes reaches 1,000 microns. Therefore, in the case of a package molded with an organic resin such as a module for example, it is easily influenced by variations in electric charge and water content in the resin, caused by changes in humidity and temperature. This results in deterioration in the voltage controlling ability of the inverter, and in the worst case, the operation of a train or the like may be impeded.

Figure 5:
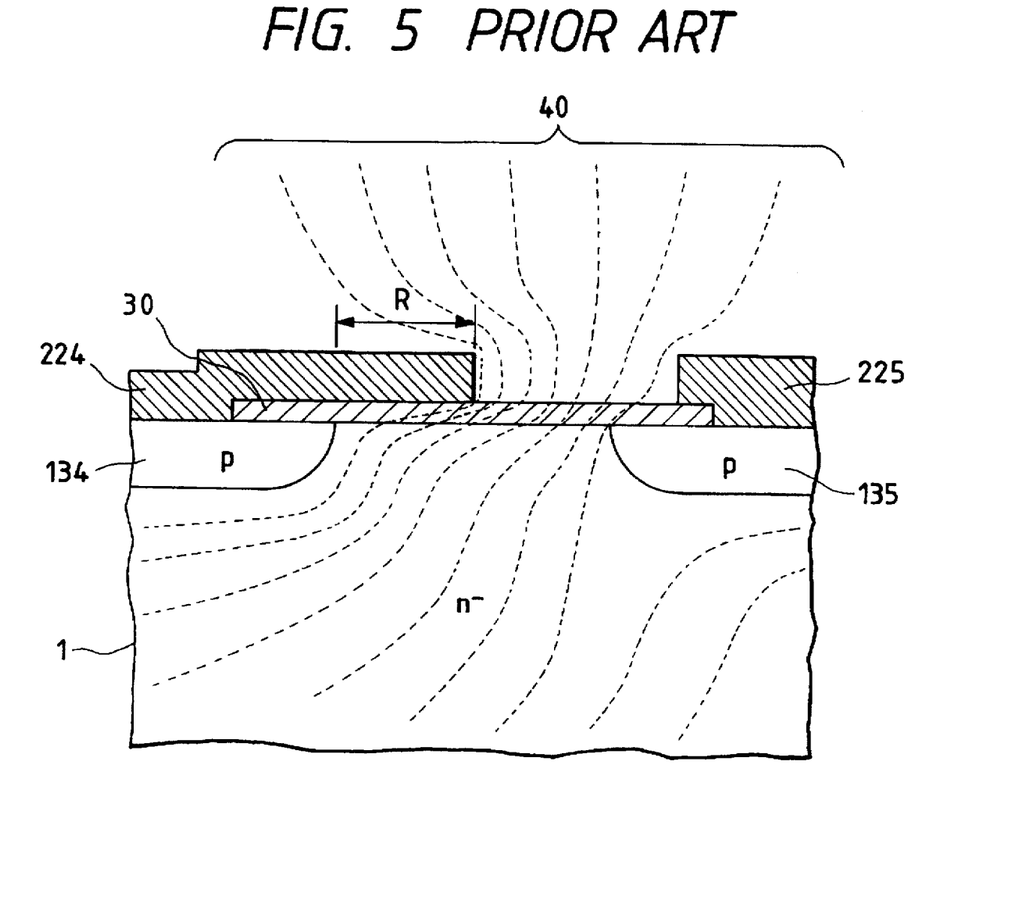
FIG. 5 is a partially enlarged view of FIG. 4.

FIG. 5 is a partially enlarged view of FIG. 4 for explaining why there occur such inconveniences. In FIG. 5, the broken lines represent equipotential lines 40. It is seen that by the forward field plate R the equipotential lines 40 are extended in the peripheral direction and that the electric field of the n– layer 12 at the corner region of the p layer 134 is relaxed. As a result of an experiment conducted by the present inventors it turned out that in a high humidity condition there is generated a minus electric charge on the surface of the insulating film 30 of the semiconductor device 1, causing p inversion of the surface of the n– layer 12. Examples of such minus electric charge are OH-ions contained in water and minus ions contained in resin.

Since the p layer 134 is at a lower potential than the p layer 135, the forward field plate R which is at the same potential as the p layer 134 becomes lower in potential than the n– layer 12. Consequently, the n– layer 12 under the forward field plate is apt to undergo P inversion. Further, the surface of the n– layer 12 which is exposed through the insulating film 30 also undergoes p inversion in the presence of minus electric charge, so that the p layers 134 and 135 are potentially connected together through the p inversion layer, whereby the effect of FLR is impaired and the blocking voltage decreases.

Figure 6:
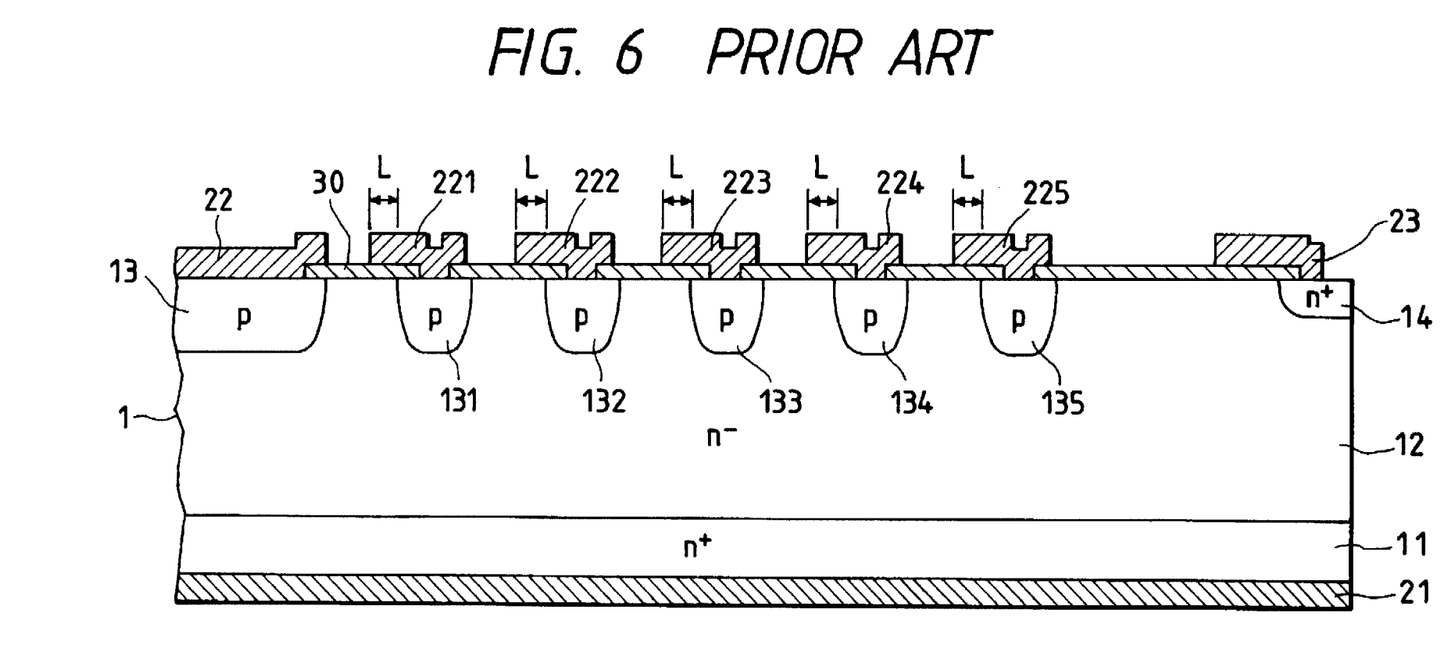
FIG. 6 illustrates a conventional termination structure.

As a structure for preventing the above inconveniences, such a termination structure as shown in FIG. 6 is described in Japanese Patent Laid Open No. Sho 59-76466. By providing a reverse field plate L in each of the FLRs 131, 132, 133, 134 and 135, the formation of the p inversion layer is prevented and the blocking voltage becomes stable.

This structure will now be explained in more detail with reference to FIG. 7. In the presence of the reverse field plate L, the potential of the p layer 135 located on the high potential side is controlled by the auxiliary electrode 225 and the potential of the surface of the n− layer 12 under the reverse field plate L can be relaxed and fixed. Since the potential of the reverse field plate L becomes higher than that of the surface of the n− layer 12 which underlies the reverse field plate, there is not formed a p inversion layer, and since the p layers 134 and 135 are not at the same potential, the blocking voltage does not drop and stabilization is attained. However, when the inverter train travels near the seashore, it is effected by salt water and particularly the reverse field plate L assumes an elongated state by the plus electric charge of sodium ions, so that the electric field at the corner region of the p layer becomes strong and the blocking voltage drops. This inconvenience is caused not only by sodium ions but also by alkali metal ions contained in a module resin or alkali metal ions which are contaminated unavoidably during the fabrication of the semiconductor device and module.

Figure 7:
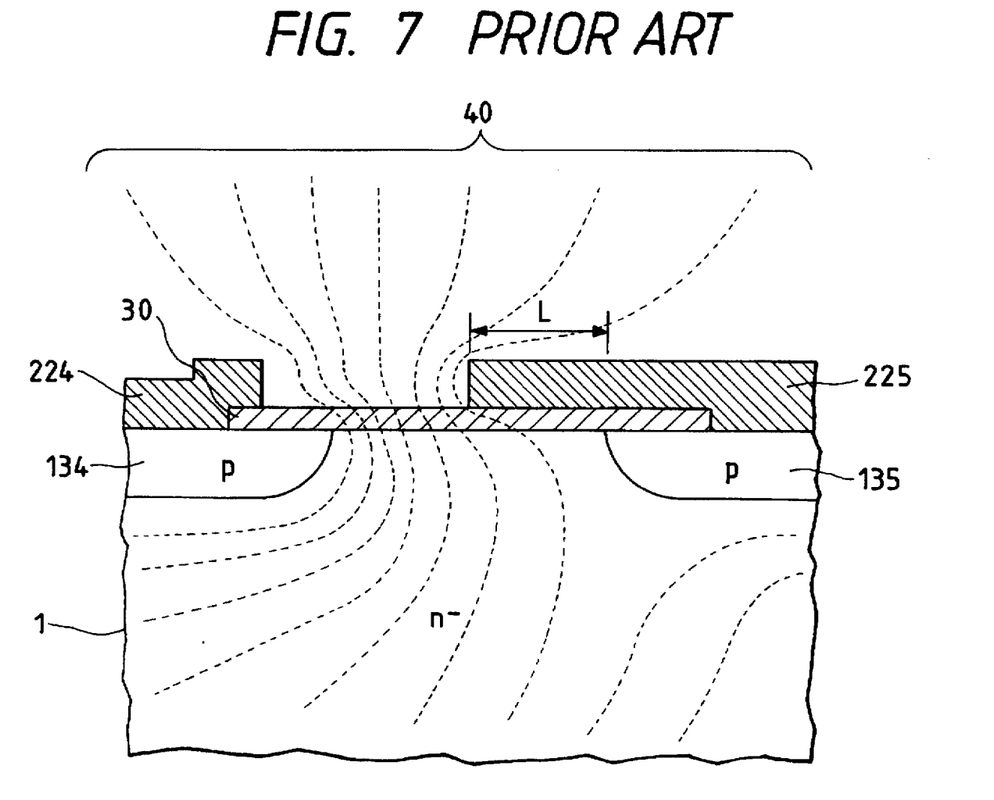
FIG. 7 is a partially enlarged view of FIG. 6.
Figure 8:
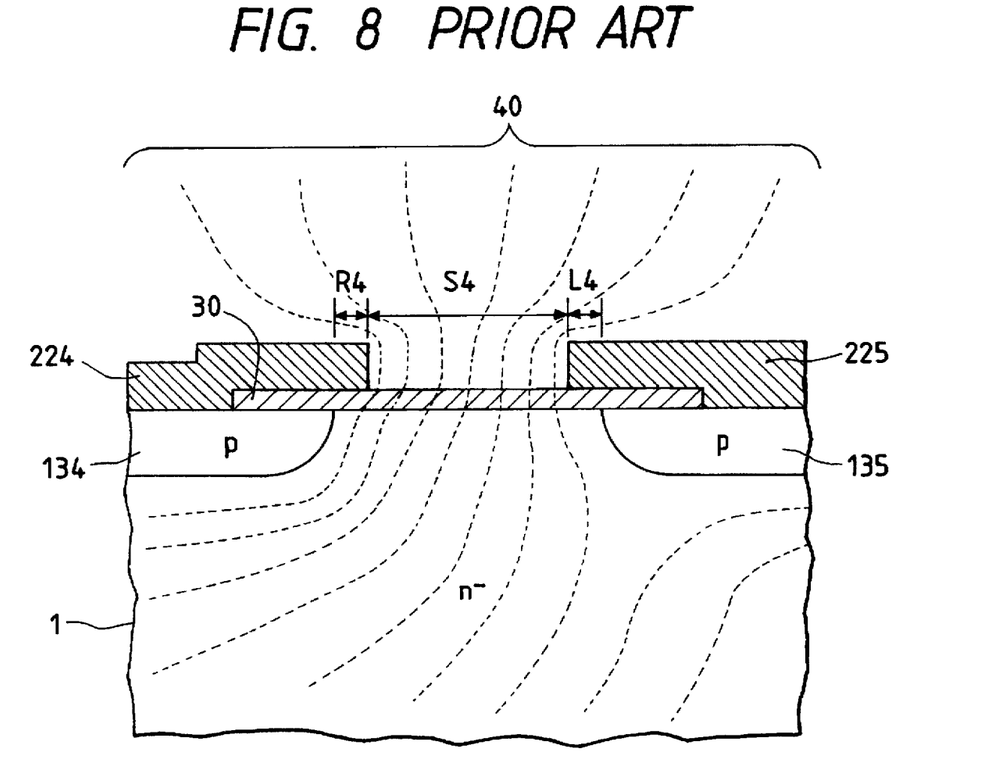
FIG. 8 illustrates a conventional structure having a forward field plate and a reverse field plate.

On the other hand, such a structure as shown in FIG. 8, having both structures of FIGS. 5 and 7 and having both forward field plate R4 and reverse field plate L4, is conceivable. By adopting such a structure there is attained stabilization of the blocking voltage, but variations in production is conspicuous and the yield is poor. As a result of investigation of the cause made by the present inventors it turned out that the organic resin covering the insulating film 30 of the semiconductor device 1 were polarized into plus and minus in a blocking voltage test, causing disturbance of the equipotential lines 40. It has also been observed in accordance with OBIC (optical beam induced current) method for example that the occurrence of voids or cracks of resin which is introduced inevitably in the course of manufacture or the formation of substances different in dielectric constant such as foreign matters on the insulating film 30 results in distortion of the equipotential lines 40, making it impossible to obtain a desired blocking voltage stably. Such inconveniences occur in a trial test of an inverter train. Due to variations in temperature of the semiconductor devices between stations and deterioration of the package caused by changes in the environment during the four seasons, there occur cracks or a change in quality of resin, etc., with the result that the dielectric constant on the insulating film 30 changes and the blocking voltage varies.

The present invention has been accomplished in view of the above-mentioned problems and aims at realizing a planar type semiconductor device stable in blocking voltage and high in yield, as well as a power converter using the same.

SUMMARY OF THE INVENTION

The semiconductor device according to the present invention has a pair of main surfaces. On one main surface side, the surface of a first semiconductor region of a first conduction type is in contact with the main surface, and there is formed a second semiconductor region of a second conduction type extending into the first semiconductor region. Further, in a surrounding relation to the second semiconductor region there is formed a third semiconductor region of a second conduction type extending into the first semiconductor region.

On the other main surface side of the semiconductor device, there is formed a first main electrode, and in the second semiconductor region is provided a second main electrode which is in ohmic-contact with the second semiconductor region and which covers the surface of the first semiconductor region through an insulating film. Further, in the third semiconductor region is provided an auxiliary electrode which is in contact at a low resistance with the third semiconductor region and which covers the surface of the first semiconductor region through an insulating film on the second semiconductor region side and on the side opposite thereto.

In such a structure, at the surface of the first semiconductor region which is in contact with one main surface of the semiconductor device, the area of the region covered with the auxiliary electrode is set at a value not less than one half of the area of the surface of the first semiconductor region which is in contact with one main surface.

In the present invention, when the junction of the first and second semiconductor regions is reverse-biased, the equipotential lines spread over the main surfaces of the semiconductor device are once gathered in the electrode-uncovered region of the first semiconductor region surface and are again spread in the first semiconductor region. In this case, since one half or more of the surface of the first semiconductor region which is in contact with one main surface of the semiconductor device is covered with the auxiliary electrode, i.e., forward field plate and reverse field plate, through an insulating film, the equipotential lines are gathered at a high density in the electrode-uncovered region of the first semiconductor region surface. Consequently, even if the equipotential lines in this region are distorted with the dielectric constant variation on the main surface of the semiconductor device, the density of equipotential lines in the gathered region of the same line becomes substantially uniform. Therefore, the equipotential lines which are again spread in the first semiconductor region are not distorted. That is, the equipotential lines in the first semiconductor region are stable and field concentration is difficult to occur, so that the blocking voltage becomes stable. Besides, even in the case of a resin package used in a severe working environment such as in an inverter train and which is apt to undergo changes with the lapse of time, a power converter of a high reliability can be realized because it is difficult to be effected by ionic substances or water.

DESCRIPTION OF THE PREFERRED EMBODIMENTS

The present invention will be described in detail hereinunder by way of embodiments thereof.

Figure 1:
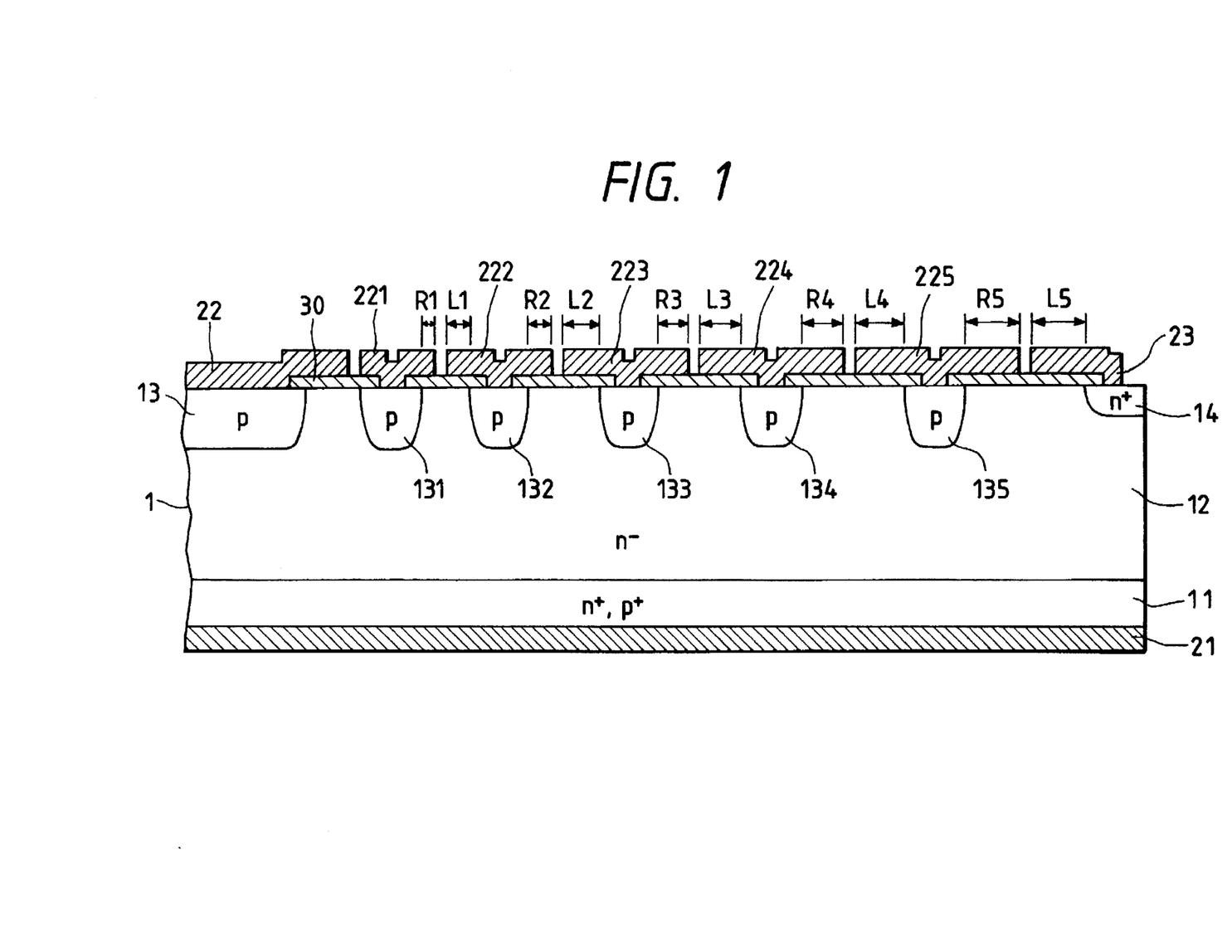
FIG. 1 is a sectional view showing a termination region of a high voltage semiconductor device according to an embodiment of the present invention.

FIG. 1 is a sectional view showing a termination region in a high-voltage semiconductor device according to an embodiment of the present invention. In the semiconductor device, indicated at 1, an n− layer 12 is formed on an n+ or p+ type semiconductor substrate 11. The conduction type (also referred to as conductivity type) of the semiconductor substrate 11 is p+ type in the case of a semiconductor device having a p emitter layer such as an insulated gate type bipolar transistor or a MOS controlled thyristor, and it is n+ type in the case of a MOSFET or a diode. The semiconductor substrate 11 is in contact with one main surface, while the n− layer 12 is in contact with the other main surface. A p layer 13 is formed by diffusion from the main surface with which the n− layer 12 is in contact. In a surrounding relation to the p layer 13 are formed p layers 131, 132, 133, 134 and 135 as FLRs. Further, as an outermost peripheral layer of the semiconductor device 1 there is formed an n+ layer 14 as a channel stopper so as to surround those FLRs. A main electrode 21 is formed on the main surface with which the semiconductor substrate 11 is in contact while another main electrode 22 having a forward field plate is formed on the p layer 13, each in the state of low resistance ohmic-contact. On the p layers 131, 132, 133, 134, 135 and n+ layer 14 are formed with auxiliary electrodes 221, 222, 223, 224, 225 and 23, respectively, so as to be in ohmic-contact at a low resistance with those layers. The auxiliary electrodes 221 to 225 have forward and reverse field plates which cover the surface of the n− layer 12 each through an insulating film 30. Likewise, the auxiliary electrode 23 has a reverse field plate.

The difference of the present invention from the conventional structures shown in FIGS. 4 and 6 resides in that the auxiliary electrodes 221, 222, 223, 224, 225 and 23 cover most of the area of the main surface with which the n− layer 12 is in contact. This effect will be explained below with reference to calculation results of a potential distribution in this embodiment illustrated in FIG. 2.

Figure 2:
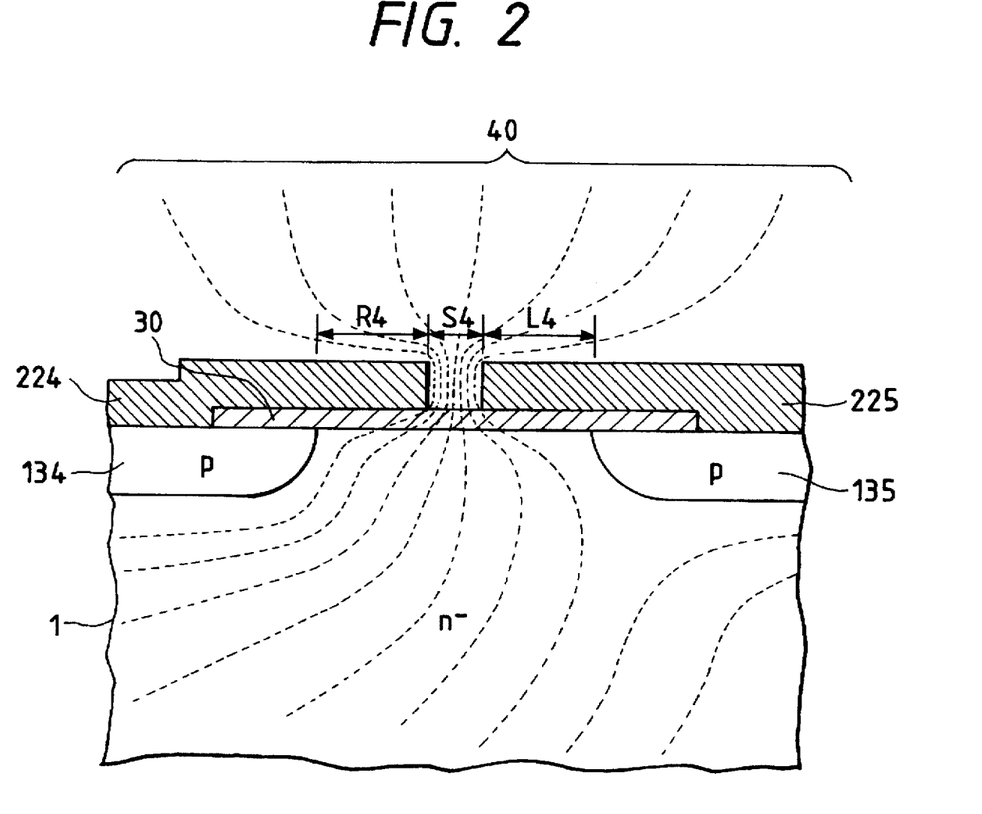
FIG. 2 is a partially enlarged view of FIG. 1.

FIG. 2 is a partially enlarged view of FIG. 1. The auxiliary electrode 224 formed on the p layer 134 has a forward field plate of length R4 through an insulating film 30. The auxiliary electrode 225 formed on the p layer 135 has a reverse field plate of length L4. The length R4 covers from an exposed position of the junction of the p layer 134 and the n− layer up to an end portion of the forward field plate of the auxiliary electrode 224. This is also true of L4.

The electric field at the corner portion of the p layer 134 is relaxed by the forward field plate, and the surface portion of the n− layer 12 near the p layer 135 has difficulty in to undergoing p inversion in the presence of the reverse field plate. Further, the distance S4 between the auxiliary electrodes 224 and 225 is extremely narrowed by both forward and reverse field plates. As will be explained later, the size of S4 is set so that the area of the n− layer which is in contact with the main surface in the position between the forward and reverse field plates is not more than one half of the area of the n− layer which is in contact with the main surface portion between the p layers 134 and 135. As a result, equipotential lines present in the n− layer 12 gather in the region S4 and are again dispersed on the auxiliary electrodes 224 and 225. Consequently, even if regions different in dielectric constant or ionic substances are formed on the auxiliary electrodes due to a change in quality of resin or under the influence of moisture, thus causing disturbance of the equipotential lines on the auxiliary electrodes, the equipotential lines substantially become uniform in density in the region S4 and are relieved of distortion. Thus, the disturbance of the exterior equipotential lines does not affect the equipotential lines present within the n− layer 12. That is, since the equipotential lines in the n− layer 12 are stabilized, a change of electric field in the same layer is unlikely to occur and hence the blocking voltage becomes stable.

Figure 9:
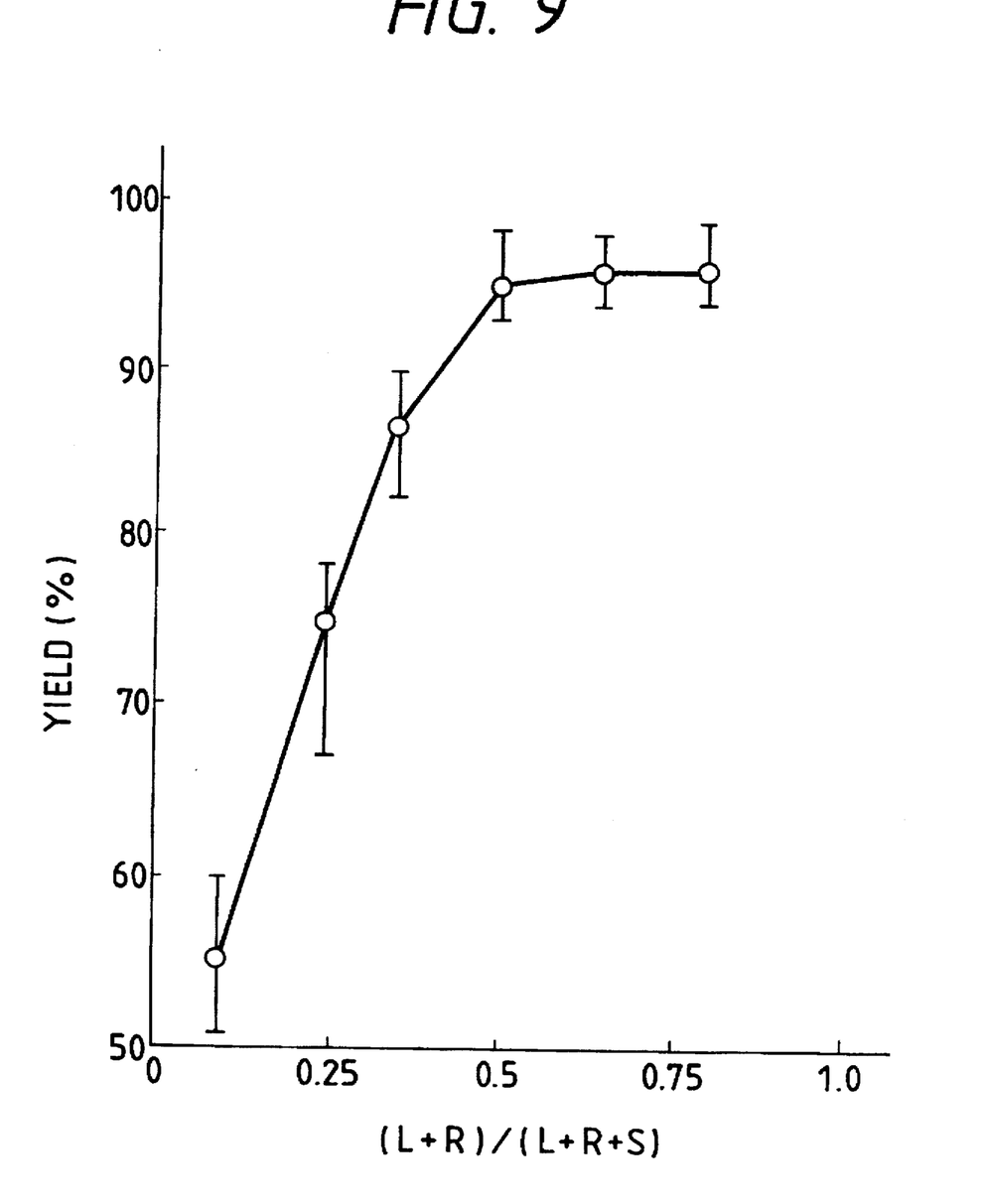
FIG. 9 illustrates a termination structure vs. yield relation.

Having made a study about desirable lengths of R4, L4 and S4, the present inventors found out that if the electric field of the region S4 is made two or more times the electric field near the p layers in the n− layer, that is, if one half or more of the area of the n− layer 12 portion exposed to the main surface is covered with forward and reverse field plates, there is attained a high yield. FIG. 9 shows the results thereof, from which it is seen that yields of 95% or so are obtained stably by setting (L+R)/(L+R+S) ratio at 0.5 or higher where the L, R and S correspond to the lengths L4, R4 and S4, respectively. In this embodiment, the dielectric breakdown strength of the insulating film 30 in the region S4 is higher than that of the semiconductor region. For example, the dielectric breakdown strength of silicon oxide film is about twenty-five times that of silicon. Therefore, even if equipotential lines crowd and the electric field intensity increases in the presence of forward and reverse field plates, there is no fear of dielectric breakdown of the region S4 and hence the deterioration of the blocking voltage does not occur.

In this embodiment, as shown in FIG. 1, in order to realize a high blocking voltage, the spacing of the p layers 131, 132, 133, 134 and 135 (the distance between adjacent p layers, i.e., the width of the n− layer portion exposed to between adjacent p layers) is set wider on the n+ layer 14 side, namely on the peripheral side. Accordingly, voltage can be dispersed almost uniformly throughout the FLRs even when equipotential lines are denser and electric field stronger on the inner side, namely on the p layer 13 side with which the main electrode 22 is in contact. More preferably, the reverse field plate is made longer than the forward field plate on the inner side, whereby a higher voltage can be attained more easily. This is because in the presence of the reverse field plate it is easier to transmit and disperse potential to the peripheral FLR without formation of a p inversion layer. It is more desirable that the length of the reverse field plate be larger than the depth of p layer as FLR.

It goes without saying that the structure of the present invention wherein equipotential lines are gathered densely by both forward and reverse field plates, as shown in FIG. 1, is applicable also between the outermost p layer 135 as FLR and the channel stopper n+ layer 14 and that the same effect as above is attained. Heretofore, since this region is the final voltage blocking region, the exposed area of the n− layer has generally been made large. However, as a result of investigation made by the present inventors, it turned out that the blocking voltage is apt to vary due to foreign matters different in dielectric constant which are introduced unavoidably in the course of manufacture, as well as voids and cracks of an organic resin. There has also been the problem that in a blocking voltage reliability test the organic resin which covers the insulating film 30 of the semiconductor device 1 is polarized to plus and minus and the equipotential lines, indicated at 40, are distorted, thus making it impossible to obtain a desired blocking voltage in a stable manner. By further applying the present invention to between the p layer 135 and the n+ layer 14 it is made possible to stabilize the production yield to a value not smaller than 95%.

The first embodiment of the present invention has been described above, but also with respect to the case where the conduction type of each semiconductor region in the above embodiment is made opposite in polarity, there are attained the same function and effect.

Moreover, by forming a semi-insulating film on each auxiliary electrode and allowing the electric field between electrodes to be rendered uniform with the electric current flowing through the semi-insulating film, it is possible to further stabilize the blocking voltage. If an insulating film is further formed on each auxiliary electrode, the polarization and cracking of the resin when incorporated into a package become less influential because of reduced influence of a change in dielectric constant of the upper region of the semiconductor region.

An insulated gate type bipolar transistor (hereinafter referred to simply as "IGBT") module of a blocking voltage of 2 kV containing diodes and IGBTs having the planar structure according to the present invention can ensure reliability equal to or higher than that of a high voltage element of bevel structure enclosed in a flat ceramic package of the conventional compression contacted type.

The following description is now provided about embodiments of power converters using the semiconductor device according to the present invention.

Figure 10:
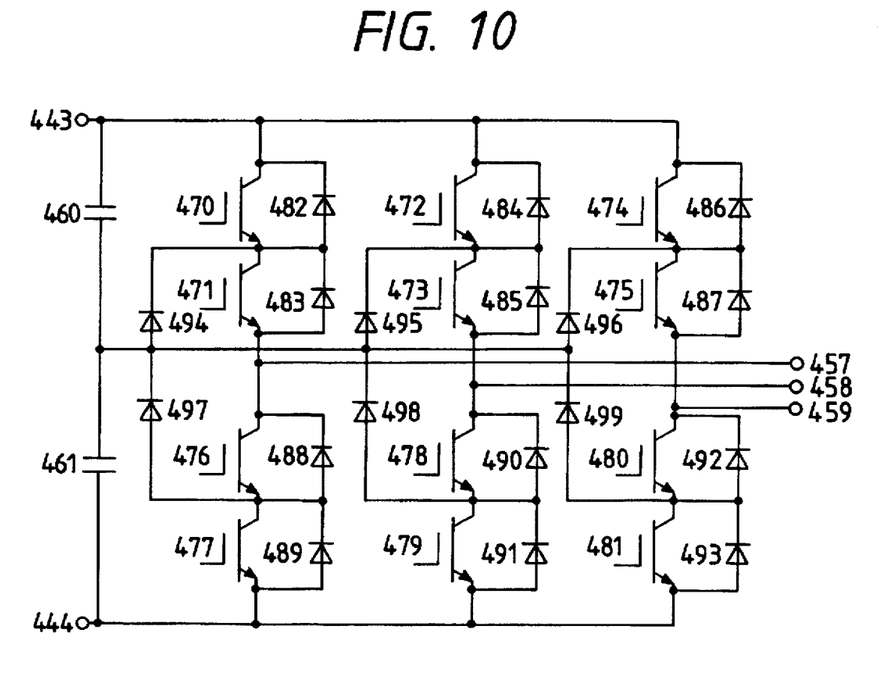
FIG. 10 illustrates a main circuit of an inverter as an embodiment using IGBTs and diodes according to the present invention.

FIG. 10 shows a main circuit of an inverter as an embodiment using IGBTs and diodes according to the present invention. The illustrated inverter is a series, multiple inverter, more particularly a three-phase inverter of the so-called neutral point clamp type. The inverter is provided with a pair of direct current terminals 443 and 444, and three alternating current terminals 457 to 459 which number is equal to the number of phases. To each direct current terminal is connected a direct current power source, and by switching IGBTs 470–481 a direct current power is converted to an alternating current power, which is then outputted to the alternating current terminals. Between the direct current terminals are connected filter capacitors 460 and 461 which are connected in series with each other.

IGBT sets 470–471, 472–473, 474–475, 476–477, 478–479 and 480–481 are connected in series, respectively, and clamp diodes 494 to 499 are connected between the respective connection points Of those IGBT sets and the connection point of the filter capacitors 460 and 461. Two IGBT sets, say, the series connected IGBT sets 470–471 and likewise connected IGBT sets 476–477 are further connected in series, and both ends thereof are connected between the direct current terminals. Further, the alternating current terminals are taken out from the connection points of such paired IGBT sets. The IGBTs 470 to 481 and the diodes 482 to 493 have the termination structure shown in FIG. 1, and they are enclosed separately in a plurality of resinous packages.

According to this embodiment, the IGBTs and diodes are difficult to undergo the influence of ionic substances and water, so even in the case of using a resinous package which is apt to exhibit changes with the lapse of time under a severe working environment, for example in an inverter train, it is possible to realize an inverter control unit of high reliability and high voltage.

When a trial test of an inverter train carrying the inverter of this embodiment thereon was conducted, there occurred cracking and a change in quality of the resin, etc. and the resultant change in dielectric constant on the insulating film 30 due to deterioration of the package caused by changes in temperature of the semiconductor device between stations and environmental changes during the four seasons. Even in this case there could be confirmed a high reliability such that there was neither a change in the blocking voltage of the semiconductor device nor an increase of leakage current.

Figure 11:
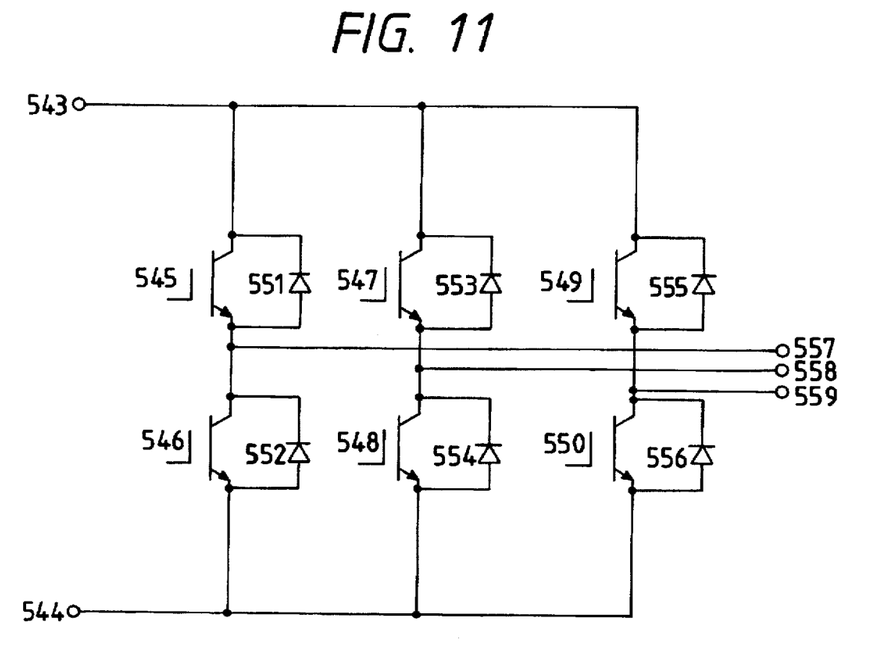
FIG. 11 illustrates a main circuit of an inverter as another embodiment using IGBTs and diodes according to the present invention.

FIG. 11 shows a main circuit of an inverter as another embodiment using IGBTs and diodes according to the present invention. The inverter of this embodiment, like the previous embodiment, is also provided with a pair of direct current terminals 543 and 544, and three alternating current terminals 557 to 559 which number is equal to the number of phases. A direct current power source is connected to each direct current terminal, and by switching IGBTs 545–550 a direct current power is converted to an alternating current power, which is then outputted to the alternating current terminals. IGBT sets 545–546, 547–548 and 549–550 are connected in series, respectively, and the respective both ends are connected between the direct current terminals. An alternating current terminal is taken out from a series connection point of two IGBTs in each IGBT set. To each IGBT is connected a diode in the form of anti-parallel connection for the reflux of load current. Also in this embodiment, the IGBTs and diodes have the termination structure shown in FIG. 1 and they are enclosed separately in a plurality of resinous packages. For example, two IGBTs and two diodes for one phase are enclosed in one package. The inverter of this embodiment also affords the same function and effect as those of the inverter of the previous embodiment.

According to the present invention, as set forth hereinabove, a high voltage semiconductor device having a stable blocking voltage can be realized even in a severe environment, for example in an inverter train. Further, a power converter using the semiconductor device of the present invention can improve its reliability.

We claim:

1. A semiconductor device including:

a pair of main surfaces;

a first semiconductor region of a first conductivity type having a surface which is in contact with one main surface;

a second semiconductor region of a second conductivity type extending from the one main surface into the first semiconductor region;

a plurality of third semiconductor regions of the second conductivity type formed so as to surround the second semiconductor region and extending from the one main surface into the first semiconductor region;

a first main electrode formed on the other main surface;

a second main electrode which is in ohmic-contact with the second semiconductor region and which covers the surface of the first semiconductor region through an insulating film; and a plurality of auxiliary electrodes which are respectively in ohmic-contact with the third semiconductor regions and which cover the surface of the first semiconductor region through an insulating film on the second semiconductor region side and on the side opposite thereto, wherein at the surface of the first semiconductor region which is in contact with the one main surface, the area of the region covered with the auxiliary electrodes is not less than one half of the area of the surface of the first semiconductor region which is in contact with the one main surface, wherein the distance between one of the third semiconductor regions and a second one of the third semiconductor regions adjacent to said one of the third semiconductor regions on a peripheral side of the semiconductor device is wider than the distance between said one of the third semiconductor regions and a third one of the third semiconductor regions adjacent to said one of the third semiconductor regions on an inner side, and wherein between the third semiconductor regions adjacent to each other, the area of one of the auxiliary electrodes which covers the surface of the first semiconductor region on the peripheral side of the semiconductor device is wider than the area of an adjacent one of the auxiliary electrodes which covers the surface of the first semiconductor region on the inner side.

2. A semiconductor device including:

a pair of main surfaces;

a first semiconductor region of a first conductivity type having a surface which is in contact with one main surface side;

a second semiconductor region of a second conductivity type extending from the one main surface into the first semiconductor region;

a plurality of third semiconductor regions of the second conductivity type formed so as to surround the second semiconductor region and extending from the one main surface into the first semiconductor region;

a fourth semiconductor region of the first conductivity type formed so as to further surround the third semiconductor region and extending from the one main surface into the first semiconductor region;

a first main electrode formed on the other main surface;

a second main electrode which is in ohmic-contact with the second semiconductor region and which covers the surface of the first semiconductor region through an insulating film;

a plurality of first auxiliary electrodes which are respectively in ohmic-contact with the third semiconductor regions and which cover the surface of the first semiconductor region through an insulating film on the second and fourth semiconductor region sides; and a second auxiliary electrode which is in ohmic contact with the fourth semiconductor region and which covers the surface of the first semiconductor region through an insulating film on the third semiconductor region side, wherein at the surface of the first semiconductor region which is in contact with the one main surface, the total area of the regions covered with the second main electrode and at least one of the second auxiliary electrodes and the first auxiliary electrodes is not less than one half of the area of the surface of the first semiconductor region which is in contact with the one main surface, wherein the distance between one of the third semiconductor regions and a second one of the third semiconductor regions adjacent to said one of the third semiconductor regions on the fourth semiconductor region side is wider than the distance between said one of the third semiconductor regions and a third one of the third semiconductor regions adjacent to said one of the third semiconductor regions on the second semiconductor region side, and the distance between the fourth semiconductor region and the third semiconductor region adjacent to the fourth semiconductor region is wider than the distance between the third semiconductor regions which are adjacent to each other, and wherein between the third semiconductor regions adjacent to each other, the area of one of the first auxiliary electrodes which covers the surface of the first semiconductor region on the fourth semiconductor region side is wider than the area of an adjacent one of the first auxiliary electrode which covers the surface of the first semiconductor region on the second semiconductor region side, and between the fourth semiconductor region and the third semiconductor region adjacent to the fourth semiconductor region, the area of the second auxiliary electrode which covers the surface of the first semiconductor region is wider than the area of the first auxiliary electrode which covers the surface of the first semiconductor region.

3. A semiconductor device according to claim 2, wherein the length of the first auxiliary electrodes on the second semiconductor region side on the surface of the first semiconductor region is larger than the depth of the third semiconductor regions extending into the first semiconductor region.

4. A semiconductor device according to claim 2, wherein the second main electrode, the first auxiliary electrodes and the second auxiliary electrode are covered with an insulating film or a semi-insulating film.

5. A power converter including:

a pair of direct current terminals;

alternating current terminals in a number equal to the number of phases; and a semiconductor switching element connected between the direct current terminals and the alternating current terminals, said semiconductor switching element including:

a pair of main surfaces;

a first semiconductor region of a first conductivity type having a surface which is in contact with one main surface;

a second semiconductor region of a second conductivity type extending from the one main surface into the first semiconductor region;

a plurality of third semiconductor regions of the second conductivity type formed so as to surround the second semiconductor region and extending from the one main surface into the first semiconductor region;

a first main electrode formed on the other main surface of a semiconductor substrate;

a second main electrode which is in ohmic-contact with the second semiconductor region and which covers the surface of the first semiconductor region through an insulating film; and a plurality of auxiliary electrodes which are respectively in ohmic-contact with the third semiconductor regions and which cover the surface of the first semiconductor region through an insulating film on the second semiconductor region side and on the side opposite thereto, wherein at the surface of the first semiconductor region which is in contact with the one main surface, the total area of the regions covered with the auxiliary electrodes is not less than one half of the area of the surface of the first semiconductor region which is in contact with the one main surface, wherein the distance between one of the third semiconductor regions and a second one of the third semiconductor regions adjacent to said one of the third semiconductor regions on a peripheral side of the semiconductor switching element is wider than the distance between said one of the third semiconductor regions and a third one of the third semiconductor regions adjacent to said one of the third semiconductor regions on an inner side of the semiconductor switching element, and wherein between the third semiconductor regions adjacent to each other, the area of one of the auxiliary electrodes which covers the surface of the first semiconductor region on the peripheral side is wider than the area of an adjacent one of the auxiliary electrodes which covers the surface of the first semiconductor region on the inner side.

6. A power converter including:

a pair of direct current terminals;

alternating current terminals in a number equal to the number of phases; and a semiconductor switching element connected between the direct current terminals and the alternating current terminals, said semiconductor switching element including:

a pair of main surfaces;

a first semiconductor region of a first conductivity type having a surface which is in contact with one main surface;

a second semiconductor region of a second conductivity type extending from the one main surface into the first semiconductor region;

a plurality of third semiconductor regions of the second conductivity type formed so as to surround the second semiconductor region and extending from the one main surface into the first semiconductor region;

a fourth semiconductor region formed so as to further surround the third semiconductor region and extending from the one main surface into the first semiconductor region;

a first main electrode formed on the other main surface;

a second main electrode which is in ohmic-contact with the second semiconductor region and which covers the surface of the first semiconductor region through an insulating film;

a plurality of first auxiliary electrodes which are respectively in ohmic-contact with the third semiconductor regions and which cover the surface of the first semiconductor region through an insulating film on the second and fourth semiconductor region sides; and a second auxiliary electrode which is in ohmic contact with the fourth semiconductor region and which covers the surface of the first semiconductor region through an insulating film on the third semiconductor region side, wherein at the surface of the first semiconductor region which is in contact with the one main surface, the total area of the regions covered with the second main electrode and at least one of the second auxiliary electrode and the first auxiliary electrodes is not less than one half of the area of the surface of the first semiconductor region which is in contact with the one main surface, wherein the distance between one of the third semiconductor regions and a second one of the third semiconductor regions adjacent to said one of the third semiconductor regions on the fourth semiconductor region side is wider than the distance between said one of the third semiconductor regions and a third one of the third semiconductor regions adjacent to said one of the third semiconductor regions on the second semiconductor region side, and the distance between the fourth semiconductor region and the third semiconductor region adjacent to the fourth semiconductor region is wider than the distance between the third semiconductor regions adjacent to each other, and wherein between the third semiconductor regions adjacent to each other, the area of one of the first auxiliary electrodes which covers the surface of the first semiconductor region on the fourth semiconductor region side is wider than the area of an adjacent one of the first auxiliary electrodes which covers the surface of the first semiconductor region on the second semiconductor region side and between the fourth semiconductor region and the third semiconductor region adjacent to the fourth semiconductor region, the area of the second auxiliary electrode which covers the surface of the first semiconductor region is wider than the area of the first auxiliary electrode which covers the surface of the first semiconductor region.

7. A semiconductor device according to claim 2, wherein the auxiliary electrodes have forward field plates on the fourth semiconductor region side and reverse field plates on the second semiconductor region side.

8. A semiconductor device according to claim 1, wherein the length of the auxiliary electrodes on the inner side on the surface of the first semiconductor region is larger than the depth of the third semiconductor regions extending into the first semiconductor region.

9. A semiconductor device including:

a pair of main surfaces;

a first semiconductor region of a first conductivity type having a surface which is in contact with one main surface;

a second semiconductor region of a second conductivity type extending from the one main surface into the first semiconductor region;

a plurality of third semiconductor regions of the second conductivity type formed so as to surround the second semiconductor region and extending from the one main surface into the first semiconductor region;

a first main electrode formed on the other main surface;

a second main electrode which is in ohmic-contact with the second semiconductor region and which covers the surface of the first semiconductor region through an insulating film; and a plurality of auxiliary electrodes which are respectively in ohmic-contact with the third semiconductor regions and which cover the surface of the first semiconductor region through an insulating film on the second semiconductor region side and on the side opposite thereto, wherein at the surface of the first semiconductor region which is in contact with the one main surface, the area of the region covered with the auxiliary electrodes is not less than one half of the area of the surface of the first semiconductor region which is in contact with the one main surface, wherein the distance between one of the third semiconductor regions and a second one of the third semiconductor regions adjacent to said one of the third semiconductor regions on a peripheral side of the semiconductor device is wider than the distance between said one of the third semiconductor regions and a third one of the third semiconductor regions adjacent to said one of the third semiconductor regions on an inner side of the semiconductor device, and wherein the length of the auxiliary electrodes on the inner side on the surface of the first semiconductor region is larger than the depth of the third semiconductor regions extending into the first semiconductor region.

10. A semiconductor device including:

a pair of main surfaces;

a first semiconductor region of a first conductivity type having a surface which is in contact with one main surface;

a second semiconductor region of a second conductivity type extending from the one main surface into the first semiconductor region;

a plurality of third semiconductor regions of the second conductivity type formed so as to surround the second semiconductor region and extending from the one main surface into the first semiconductor region;

a fourth semiconductor region of the first conductivity type formed so as to further surround the third semiconductor region and extending from the one main surface into the first semiconductor region;

a first main electrode formed on the other main surface;

a second main electrode which is in ohmic-contact with the second semiconductor region and which covers the surface of the first semiconductor region through an insulating film;

a plurality of first auxiliary electrodes which are respectively in ohmic-contact with the third semiconductor regions and which cover the surface of the first semiconductor region through an insulating film on the second and fourth semiconductor region sides; and a second auxiliary electrode which is in ohmic-contact with the fourth semiconductor region and which covers the surface of the first semiconductor region through an insulating film on the third semiconductor region side, wherein at the surface of the first semiconductor region which is in contact with the one main surface, the total area of the regions covered with the second main electrode and one of the second auxiliary electrode and the first auxiliary electrode is not less than one half of the area of the surface of the first semiconductor region which is in contact with the one main surface, wherein the distance between one of the third semiconductor regions and a second one of the third semiconductor regions adjacent to said one of the third semiconductor regions on the fourth semiconductor region side is wider than the distance between said one of the third semiconductor regions and a third one of the third semiconductor regions adjacent to said one of the third semiconductor regions on the second semiconductor region side, and the distance between the fourth semiconductor region and the third semiconductor region adjacent to the fourth semiconductor region is wider than the distance between the third semiconductor regions adjacent to each other, wherein the length of the first auxiliary electrode on the second semiconductor region side on the surface of the first semiconductor region is larger than the depth of the third semiconductor region extending into the first semiconductor region.

11. A semiconductor device according to claim 2, wherein the first auxiliary electrodes have forward field plates on the fourth semiconductor region side and reverse field plates on the second semiconductor region side, and the second auxiliary electrode has a reverse field plate on the second semiconductor region side.

* * * * *